US008334508B1

(12) United States Patent
Mankos (10) Patent No.: US 8,334,508 B1
(45) Date of Patent: *Dec. 18, 2012

(54) MIRROR ENERGY FILTER FOR ELECTRON BEAM APPARATUS (75) Inventor: Marian Mankos, Palo Alto, CA (US)

(73) Assignee: Electron Optica, Inc., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/032,273

(22) Filed: Feb. 22, 2011

(51) Int. Cl.
G01N 23/04 (2006.01)
(52) U.S. Cl. .................. 250/305; 250/306; 250/311
(58) Field of Classification Search .......... 250/492.1, 250/492.3, 492.22, 492.23, 396 R, 396 ML, 250/310, 311, 306, 305
See application file for complete search history.

(56) References Cited

U.S. PATENT DOCUMENTS

| 4,760,261 | A  | * | 7/1988  | Rose et al. ......... 250/396 ML |
| 4,851,670 | A  |   | 7/1989  | Krivanek |
| 5,126,565 | A  |   | 6/1992  | Rose et al. |
| 5,319,207 | A  | * | 6/1994  | Rose et al. ............. 250/396 R |
| 6,870,172 | B1 | * | 3/2005  | Mankos et al. ......... 250/492.22 |
| 7,022,983 | B2 | * | 4/2006  | Ose et al. .................. 250/305 |
| 7,205,542 | B1 | * | 4/2007  | Mankos et al. ............ 250/310 |
| 7,342,238 | B2 | * | 3/2008  | Zywno et al. ............ 250/492.2 |
| 7,348,566 | B2 | * | 3/2008  | Tromp ..................... 250/396 R |
| 7,453,062 | B2 | * | 11/2008 | Tromp ......................... 250/305 |
| 7,566,873 | B1 | * | 7/2009  | Walker et al. ............... 250/310 |
| 7,566,882 | B1 | * | 7/2009  | Hess .......................... 250/400 |
| 7,692,167 | B1 | * | 4/2010  | Mankos ................. 250/492.23 |
| 7,714,287 | B1 | * | 5/2010  | James et al. ................ 250/310 |
| 7,816,655 | B1 | * | 10/2010 | Hess et al. ............... 250/492.2 |
| 7,838,827 | B2 | * | 11/2010 | Ose et al. .................... 250/305 |
| 8,183,526 | B1 | * | 5/2012  | Mankos ...................... 250/305 |
| 2004/0065827 | A1 | * | 4/2004  | Kienzle et al. ............. 250/311 |
| 2007/0029506 | A1 | * | 2/2007  | Zywno et al. ............ 250/491.1 |
| 2007/0181808 | A1 | * | 8/2007  | Murakoshi et al. ......... 250/310 |
| 2007/0200070 | A1 | * | 8/2007  | Tromp ..................... 250/396 R |
| 2009/0289195 | A1 | * | 11/2009 | Henstra ................... 250/396 R |

* cited by examiner

Primary Examiner — Robert Kim
Assistant Examiner — Wyatt Stoffa (57) ABSTRACT

One embodiment relates to an apparatus for forming an electron image using electrons with a narrow range of electron energies from an electron beam with a wide range of energies. An electron beam source is configured to generate an electron beam, and condenser lenses collimate the beam into an objective lens configured to illuminate the specimen. The illuminating electrons are scattered by the specimen and form an electron beam with a range of energies that enter a magnetic prism separator. After a 90 degree deflection, the prism separator introduces an angular dispersion that disperses the incoming electron beam according to its energy. A knife-edge plate removes either the high or low energy tail from the propagating beam. An electron lens is configured to focus the electron beam into an electron mirror so that after the reflection, the other energy tail is stopped on the same knife-edge plate. The remaining nearly monochromatic beam reenters the prism separator and is deflected toward the projection system and used to form a two-dimensional electron image on an electron detector. By adjusting the strength of the prism separator, the specific electron energy used for imaging is selected from the energy distribution of the scattered electrons. Other embodiments are also disclosed.

14 Claims, 6 Drawing Sheets

MIRROR ENERGY FILTER FOR ELECTRON BEAM APPARATUS

BACKGROUND OF THE INVENTION

1. Field of the Invention

The present invention relates generally to electron beam apparatus and electron microscopy methods.

2. Description of the Background Art

Optical microscopes, the simplest and most popular instruments used to image objects too small for the naked eye to see, utilize photons with visible wavelengths for imaging. The specimen is illuminated with a broad light beam, and a magnified image of the specimen can be observed using an eye piece or camera. The maximum magnification of a light microscope can be more than 1000× with a diffraction-limited resolution limit of a few hundred nanometers. Improved spatial resolution in an optical microscope can be achieved when shorter wavelengths of light, such as the ultraviolet, are utilized for imaging.

An electron microscope is a type of microscope that uses electrons to illuminate the specimen and create a magnified image of it. The microscope has a greater resolving power than a light microscope, because it uses electrons that have wavelengths few orders of magnitude shorter than visible light, and can achieve magnifications exceeding 1,000,000×. In a typical electron microscope, an electron beam is emitted in a vacuum chamber from an electron gun equipped with a thermionic (tungsten, $LaB_6$), thermally assisted (Schottky, $ZrO_2$) or cold field emission cathode. The electron beam, which typically has an energy ranging from a few hundred eV to few hundred keV and an energy spread ranging from few tenths to few eV, is collimated by one or more condenser lenses and then focused by the final objective lens to form a spot that illuminates the specimen. When the primary electron beam strikes the sample, the electrons deposit energy in a teardrop-shaped volume of the specimen known as the interaction volume, which extends from less than few nm to few μm into the surface, depending on the electron's landing energy and the composition of the specimen. Primary electrons can generate elastically scattered electrons, secondary electrons due to inelastic scattering, characteristic Auger electrons and the emission of electromagnetic radiation. Each of the generated signals can be detected by specialized detectors, amplified and displayed on a CRT display or captured digitally, pixel by pixel on a computer.

Scanning electron microscopes, the most widely used electron microscopes, image the sample surface by scanning it with a tightly focused beam of electrons in a raster scan pattern, pixel by pixel. Transmission electron microscopes (TEM) and low energy electron microscopes (LEEM) are projection (as opposed to scanning) electron microscopes, and thus resemble a conventional light microscope. In a TEM or LEEM, the electron gun forms a broad electron beam that is accelerated to typically a few to hundreds of keV and focused by the objective lens. A parallel flood beam then uniformly illuminates the substrate.

The primary electrons scattered by the specimen produce electrons over a wide range of energies, from secondary electrons in the range of a few eV, to hundreds to thousands of eV for characteristic Auger electrons, and near the landing energy for elastically scattered electrons. Electrons with different energies produce different image contrast and can provide comprehensive information about the specimen, including specimen topography, composition, crystalline structure as well as electrical and magnetic properties. In order to obtain detailed information about the chemical composition, interatomic bonding and local electronic states of non-periodic objects such as nanoparticles, interfaces, defects and macromolecules, an energy resolution of 0.2 eV or less is necessary to discern their characteristic electronic states. Effective means for selecting electrons emitted from the sample with a narrow range of energies for imaging are therefore desirable for detailed characterization of specimens.

One approach to selecting electrons for imaging with a narrow range of energies is to use an energy filter based on a magnetic prism, such as the one disclosed in U.S. Pat. No. 4,851,670, which is entitled "Energy-selected electron imaging filter" and which issued Jul. 25, 1989 to inventor Krivanek. This approach employs a single magnetic sector to disperse the electrons according to their energies and a set of multipole lenses to transform the dispersed energy spectrum into an energy-selected image and another set of multipole lenses to correct the image aberrations. However, the large number of electron-optical components can make the system difficult to align and costly. In addition, narrow and adjustable energy-selecting slits are needed in order to achieve high energy resolution. The manufacture of such fine structures with straight and parallel edges is rather complicated and their reliability of operation under heavy electron bombardment is reduced. Further, the large size of this filter and the net non-zero deflection angle introduced by the filter means that it must be attached at the end of an electron column and thus must replicate some of the optical functionality already available in the main column, e.g. variable optical zoom.

Another approach to selecting electrons for imaging with a narrow range of energies is to use an energy filter based on an omega filter, such as the one disclosed in U.S. Pat. No. 4,740,704, which is entitled "Omega-type electron energy filter" and which issued Apr. 26, 1988 to inventors Rose and Lanio. In this approach, 4 deflection regions with uniform magnetic fields are used to deflect the beam along a path that resembles the greek letter omega. The omega filter disperses the electrons according to their energies and is then returned to the same optical axis. This means that the filter can be inserted into the microscope column and switched on when energy-filtered imaging is desirable. However, narrow and adjustable energy-selecting slits are needed in order to achieve high energy resolution. The manufacture of such fine structures with straight and parallel edges is rather complicated and their reliability of operation under heavy electron bombardment is reduced.

There is significant demand in biological and medical research as well materials science for imaging of specimens at high spatial resolution and with analytical capabilities provided by projection electron microscopes with imaging energy-filtering devices.

SUMMARY

One embodiment pertains to an apparatus configured for forming an energy-filtered electron image using electrons with a narrow range of electron energies from an electron beam with a wide range of energies. An electron beam source is configured to generate an electron beam, and condenser lenses collimate the beam into an objective lens configured to illuminate the specimen. The illuminating electrons are scattered by the specimen and form an electron beam with a range of energies that enter a magnetic prism separator. After a 90 degree deflection, the prism separator introduces an angular dispersion that disperses the incoming electron beam according to its energy. A knife-edge plate removes either the high or low energy tail from the propagating beam. An electron lens is configured to focus the electron beam into an electron mirror so that after the reflection, the other energy tail is stopped on the same knife-edge plate. The remaining nearly monochromatic beam reenters the prism separator and is deflected toward the projection system and used to form a two-dimensional image on an electron detector. The specific electron energy used for imaging is selected from the energy distribution of the scattered electrons by adjusting the strength of the prism separator.

Other embodiments are also disclosed.

DETAILED DESCRIPTION

Electron Mirror-Based Imaging Energy Filter

Figure 1:
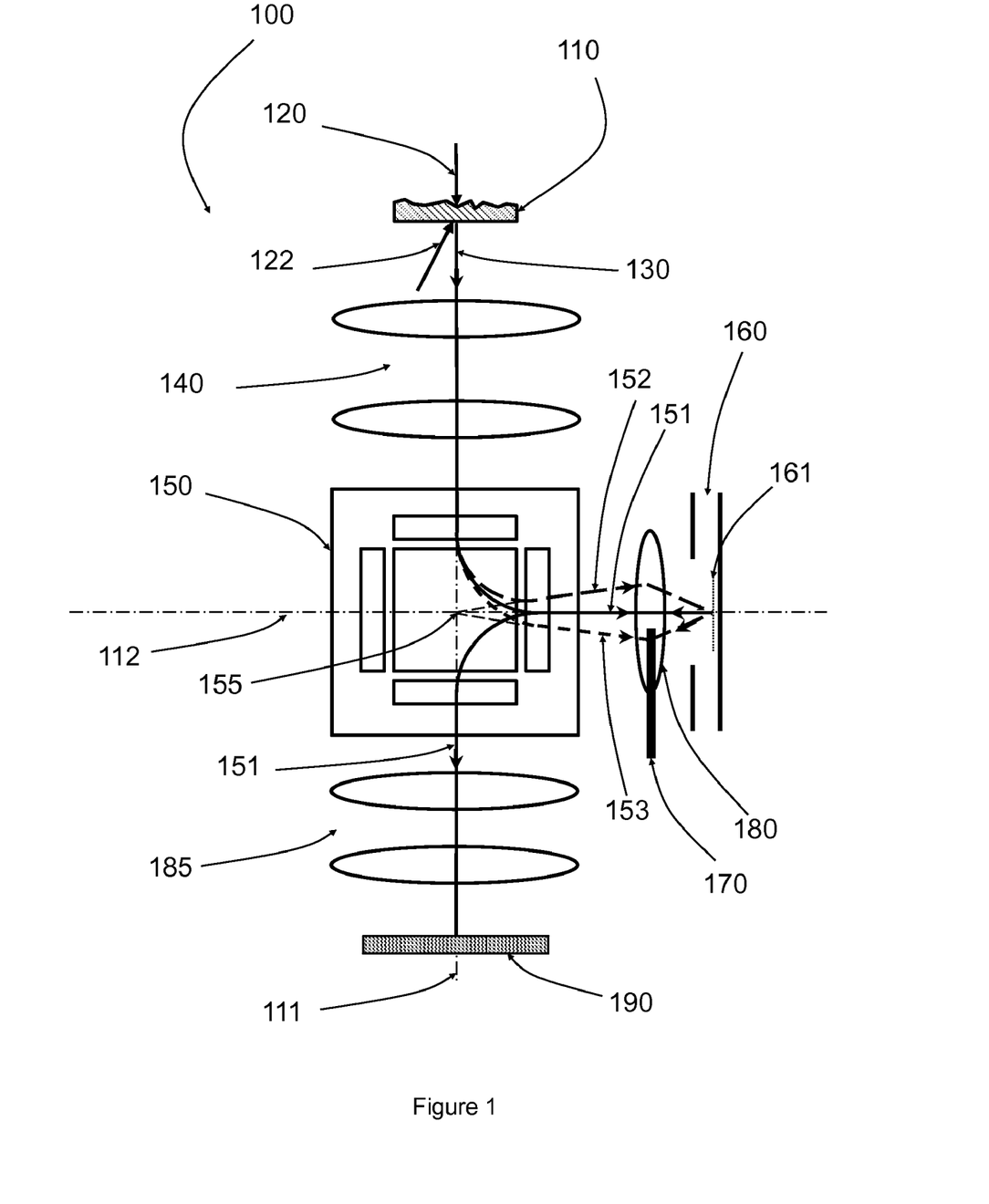
FIG. 1 is a diagram depicting a structure for an electron beam apparatus having an electron mirror-based imaging energy filter in accordance with an embodiment of the invention.
Figure 2:
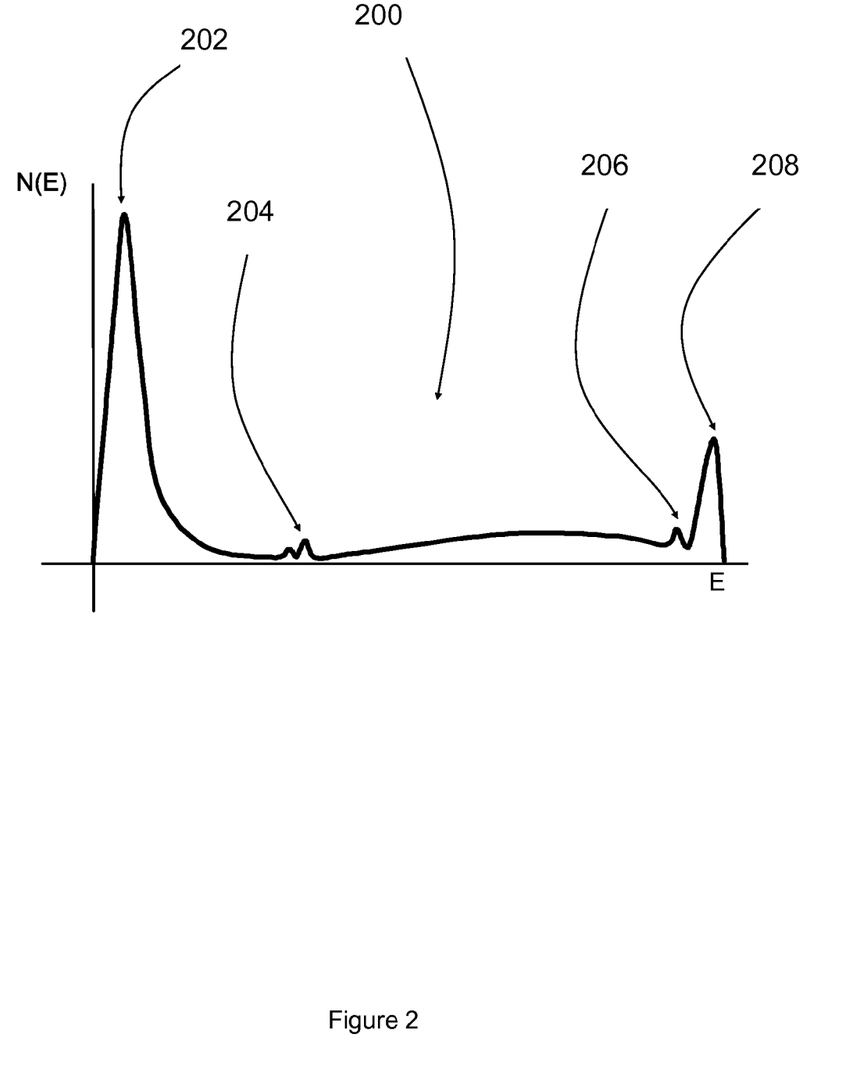
FIG. 2 is a diagram depicting the energy distribution of scattered electrons emitted from the specimen.
Figure 3:
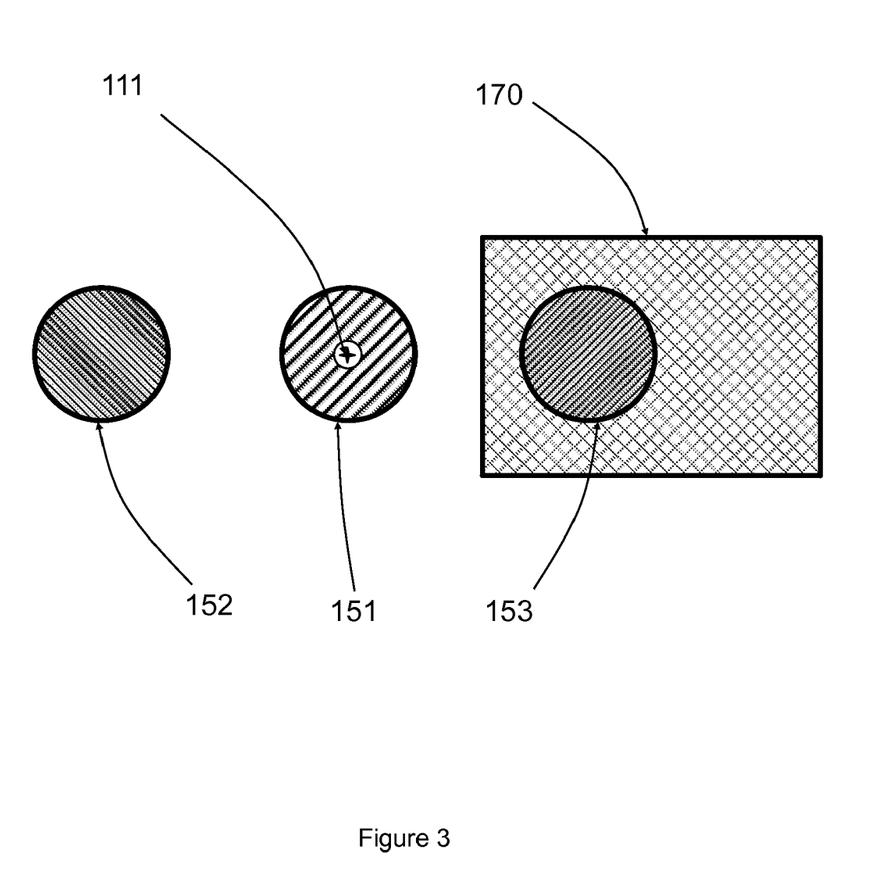
FIG. 3 is a diagram depicting the beam positions in an electron beam apparatus having an electron mirror-based imaging energy filter in accordance with an embodiment of the invention.

FIG. 1 is a diagram depicting a structure for an electron beam apparatus 100 comprising a prism array separator and an electron mirror that is configured as an imaging energy filter, i.e. only electrons with a very narrow range of energies, typically 0.2 eV or less, are used to form the final image of the specimen. In this apparatus 100, the specimen 110 is illuminated either in transmission mode by primary electrons 120 or in reflection mode by primary electrons 122. The primary electrons scatter on the specimen 110, thus generating a scattered electron beam 130 with a range of electron energies. FIG. 2 depicts the energy distribution 200 of the scattered electron beam 130 leaving the specimen 110. The scattered electron beam 130 includes electrons emitted over a range of solid angles with energies ranging from near zero (secondary electrons 202) to the landing energy (elastically transmitted or backscattered electrons 208). Electrons with intermediate energies include Auger electrons 204 and also electrons that suffered plasmon losses 206. Going back to FIG. 1, the scattered electron beam 130 including electrons with a wide energy distribution 200 is imaged by the transfer optics 140 and passes through the prism separator 150, an energy dispersive element composed of an array of uniform magnetic fields of different length and strength so as to provide a mechanism for deflection and stigmatic focusing. An optimized prism array separator 150 simultaneously images stigmatically the scattered electron beam 130 and deflects this beam by 90 degrees into the horizontal axis 112 defined by electron mirror 160, i.e. the prism separator images as a conventional round lens which greatly simplifies set-up, alignment and operation of the apparatus. The strength of the prism separator is configured to deflect electrons 151 with energy $E_s$ selected for imaging by exactly 90 degrees, while electrons 152 with lower energies are deflected by larger angles and electrons 153 with larger energies are deflected by smaller angles, due to the energy dispersion of the prism separator. By adjusting the strength of one or more sectors in prism separator 150, the selected electron energy $E_s$ can be tuned over a range of values covering a fraction or the full range of the energy distribution 200 of the scattered electron beam 130 leaving the specimen 110. The axial bundle of electron rays 151, 152 and 153 with a wide energy distribution 200 appears to emanate from a point near the center plane of the prism separator 150, also known as the achromatic plane 155. As the electrons proceed towards the electron mirror 160, a movable knife-edge plate 170 located slightly below the horizontal optical axis 112 stops one portion of the energy distribution, in this particular case the higher energy electrons 153 with energies larger than $E_s$ as shown in FIG. 1. This is demonstrated in FIG. 3, which shows a front view of the knife-edge plate 170 and the approaching electrons 151, 152 and 153. In an alternate implementation, it is also possible to locate the movable knife-edge plate 170 slightly above the optical axis 112, in which case the electrons 152 with energies smaller than $E_s$ are stopped. Going back to FIG. 1, the transfer lens 180 is configured to focus the achromatic plane 155 at the reflection plane 161 of the electron mirror 160, which is biased to a potential more negative than the electron beam potential, and thus reflects the electrons 151 and 152 back towards the prism separator 150. The electron mirror 160 is configured to reflect the incoming electrons symmetrically, i.e. electrons entering at an angle with respect to the normal to the electron mirror reflection plane 161 exit the mirror at the same angle and symmetrically with respect to the normal to the electron mirror reflection plane 161. As the remaining electrons 151 and 152 proceed back to the prism separator 150, the electrons 152 with energies smaller than $E_s$ are stopped by the same knife-edge plate 170, due to the symmetry of the reflection in the electron mirror 160. The energy width of the remaining nearly monochromatic electrons 151 with energy $E_s$ selected for imaging is defined by the position of the knife-edge plate 170 and can be adjusted by moving the knife-edge plate 170 away or towards the optical axis 112. This arrangement allows the use of a knife-edge plate as the energy selecting device, which is much simpler when compared to the narrow, often sub-micron slits needed in typical imaging energy filter applications. The mechanical design and manufacture of a knife-edge plate is much less complex when compared to a narrow slit aperture with straight and parallel edges and thus allows to select a much narrower energy distribution. In this design, an energy width of 0.2 eV or less is readily achievable. In addition, the reliability of operation of a knife-edge plate under heavy electron bombardment is much improved when compared to slit apertures, as sub-micron slits tend to clog with electron-beam induced contamination. The remaining nearly mono-energetic electrons 151 with energy $E_s$ selected for imaging then reenter the prism separator 150 which deflects this electron beam by 90 degrees back into vertical axis 111 and the projection optics 185. The net dispersion of the imaging energy filter vanishes after the double pass through the prism separator 150 and the electron mirror 160 due to symmetry, which is desirable for high resolution energy-filtered imaging. In principle, the deflection angle of the prism array can be chosen arbitrarily, however a right angle deflection by 90 degrees is particularly advantageous, since after the second deflection the beam proceeds along the vertical microscope axis 111, i.e. the imaging energy filter can be introduced into a column with a straight axis and switched on when energy-filtered imaging is desired. Once the mono-energetic electrons 151 are deflected into the projection optics 185, the electrons are focused to form a magnified electron image on the viewing screen 190.

The prism- and electron mirror-based imaging energy filter, as shown in FIG. 1, can be advantageously implemented in projection-type electron microscopes.

Figure 4A:
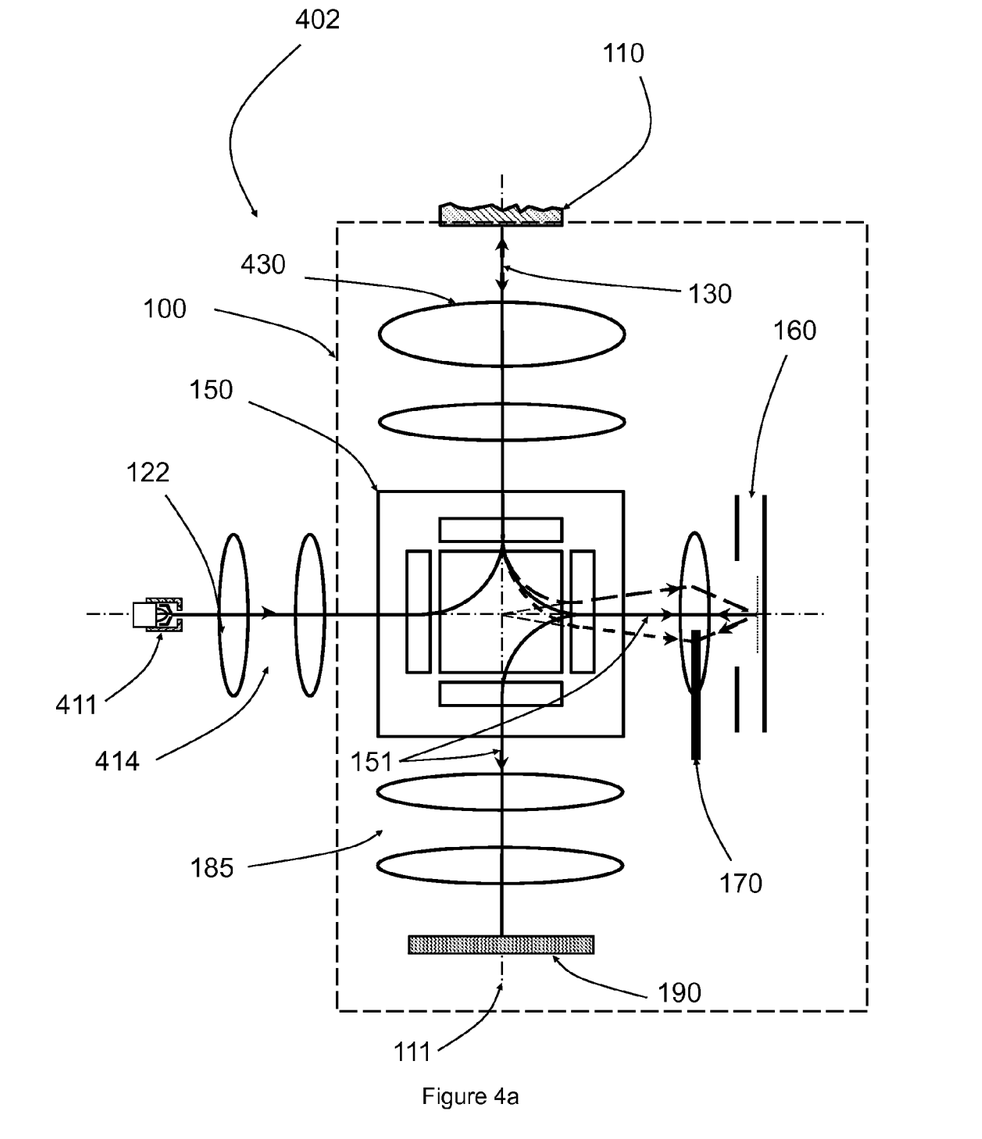
FIG. 4a is a diagram depicting a structure for an electron beam apparatus utilizing an electron mirror-based imaging energy filter in a low energy electron microscope in accordance with an embodiment of the invention.

FIG. 4a is a diagram depicting a structure for a low energy electron microscope 402 comprising a prism separator 150 and an electron mirror 160 that is configured as an imaging energy filter. In a LEEM, the primary electron beam 122 emitted by electron source 411 is collimated by illumination optics 414 into the prism separator 150 and focused by the final objective lens 430 to form a broad parallel beam that flood-illuminates the specimen 110. The electrons are scattered by the specimen and form a 2-dimensional image. The reflected scattered electron beam 130 then reenters the prism separator 150 which in conjunction with mirror 160 selects a nearly mono-energetic beam of electrons 151 with energy $E_s$ for imaging. The strength of the prism separator section affecting the scattered electron beam 130 with a wide range of energies is configured to deflect electrons 151 with energy $E_s$ selected for imaging by exactly 90 degrees, while all electrons 152 with lower energies are deflected by larger angles and all electrons 153 with larger energies are deflected by smaller angles, due to the energy dispersion of the prism separator. By adjusting the strength of one or more sectors in prism separator 150, the selected electron energy $E_s$ can be tuned over a range of values covering the full range of the energy distribution 200 of the scattered electron beam 130 leaving the specimen 110. The energy width of the remaining nearly monochromatic electrons 151 with energy $E_s$ selected for imaging is defined by the position of the knife-edge plate 170 and can be adjusted by moving the knife-edge plate. This arrangement utilizes a simple knife-edge plate 170 as the energy selecting device, which is much simpler when compared to the narrow, often sub-micron slits needed in typical imaging energy filter applications. The mechanical design and manufacture of a knife-edge plate is much less complex when compared with a narrow slit aperture with straight and parallel edges and thus allows to select a much narrower energy distribution. In this design, an energy width of 0.2 eV or less is achievable. In addition, the reliability of operation of a knife-edge plate under heavy electron bombardment is much improved when compared to slit apertures, as sub-micron slits tend to clog with electron-beam induced contamination. The remaining nearly mono-energetic electrons 151 with energy $E_s$ selected for imaging then reenter the prism separator 150 which deflects this electron beam by 90 degrees back into vertical axis 111 and projection optics 185 that forms a magnified image on a viewing screen 190. After the double pass through the prism separator 150 and the electron mirror 160 the dispersion of the imaging energy filter vanishes due to symmetry, which is desirable for high resolution energy-filtered imaging in a LEEM.

Figure 4B:
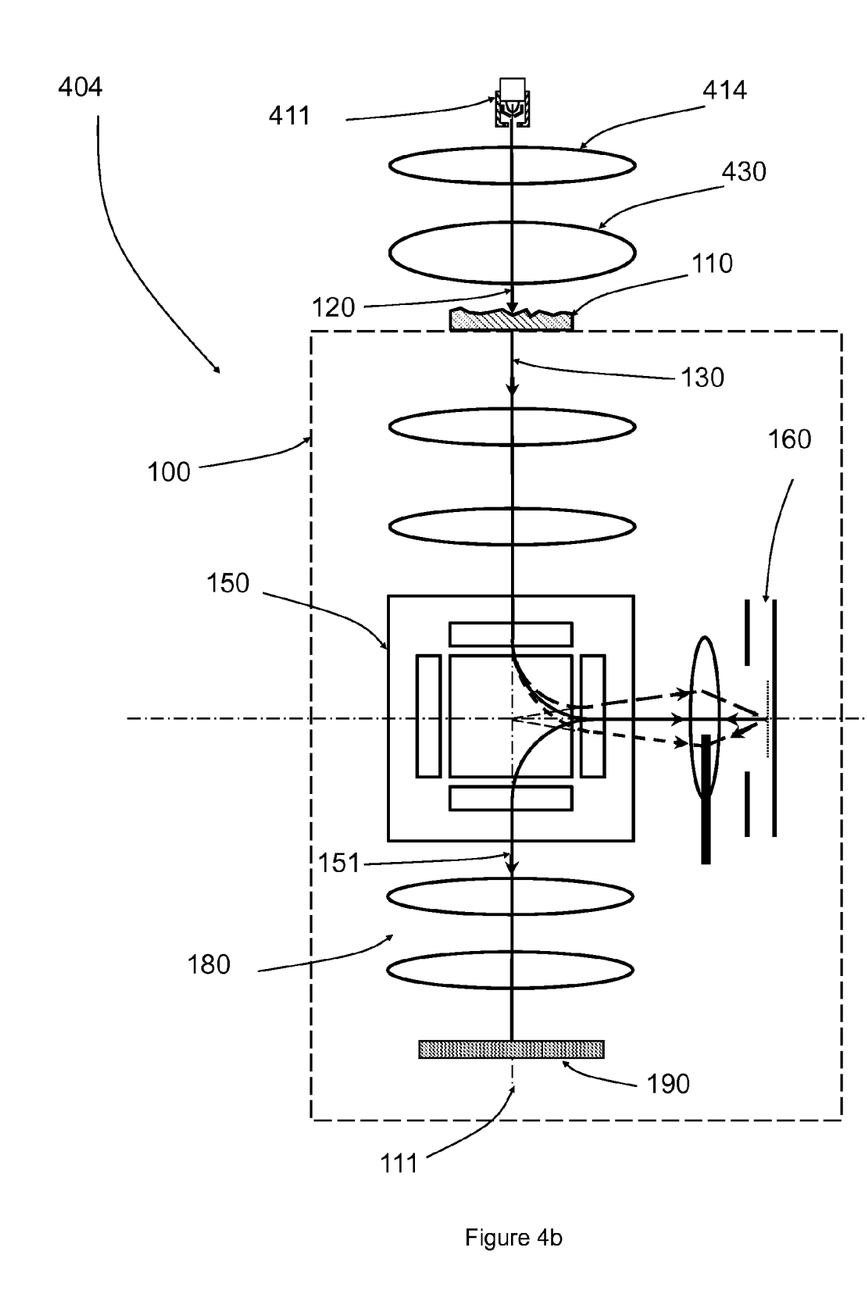
FIG. 4b is a diagram depicting a structure for an electron beam apparatus utilizing an electron mirror-based imaging energy filter in a transmission electron microscope in accordance with an embodiment of the invention.

FIG. 4b is a diagram depicting a structure for a transmission electron microscope 404 comprising a prism array separator 150 and an electron mirror 160 that is configured as an imaging energy filter. In a TEM, the primary electron beam 120 emitted by electron source 411 is focused by the condenser lenses 414 and objective lens 430 to form a broad parallel beam that flood-illuminates the specimen 110. The electrons are scattered by the specimen and form a 2-dimensional image. The transmitted scattered electron beam 130 then enters the imaging energy filter 100 comprising the prism separator 150 which in conjunction with mirror 160 selects a nearly mono-energetic beam of electrons 151 with energy $E_s$ for imaging. By adjusting the strength of one or more sectors in prism separator 150, the selected electron energy $E_s$ can be tuned over a range of values covering a portion of the energy distribution 200 of the scattered electron beam 130 leaving the specimen 110. The energy width of the remaining nearly monochromatic electrons 151 with energy $E_s$ selected for imaging is defined by the position of the knife-edge plate 170 and can be adjusted by moving the knife-edge plate. This arrangement allows the use of a simple knife-edge plate 170 as the energy selecting device, which is much simpler when compared to the narrow, often sub-micron slits needed in typical imaging energy filter applications. The mechanical design and manufacture of a knife-edge plate is much less complex when compared with a narrow slit aperture with straight and parallel edges and thus allows to select a much narrower energy distribution. In this design, an energy width of 0.2 eV or less is achievable. In addition, the reliability of operation of a knife-edge plate under heavy electron bombardment is much improved when compared to slit apertures, as sub-micron slits tend to clog with electron-beam induced contamination. The remaining nearly mono-energetic electrons 151 with energy $E_s$ selected for imaging then enter the prism separator 150 which deflects this electron beam by 90 degrees back into vertical axis 111 and projection optics 185 and form a magnified image on a viewing screen 190. After the double pass through the prism separator 150 and the electron mirror 160 the dispersion of the imaging energy filter vanishes due to symmetry, which is desirable for high resolution energy-filtered imaging in a TEM.

Figure 5:
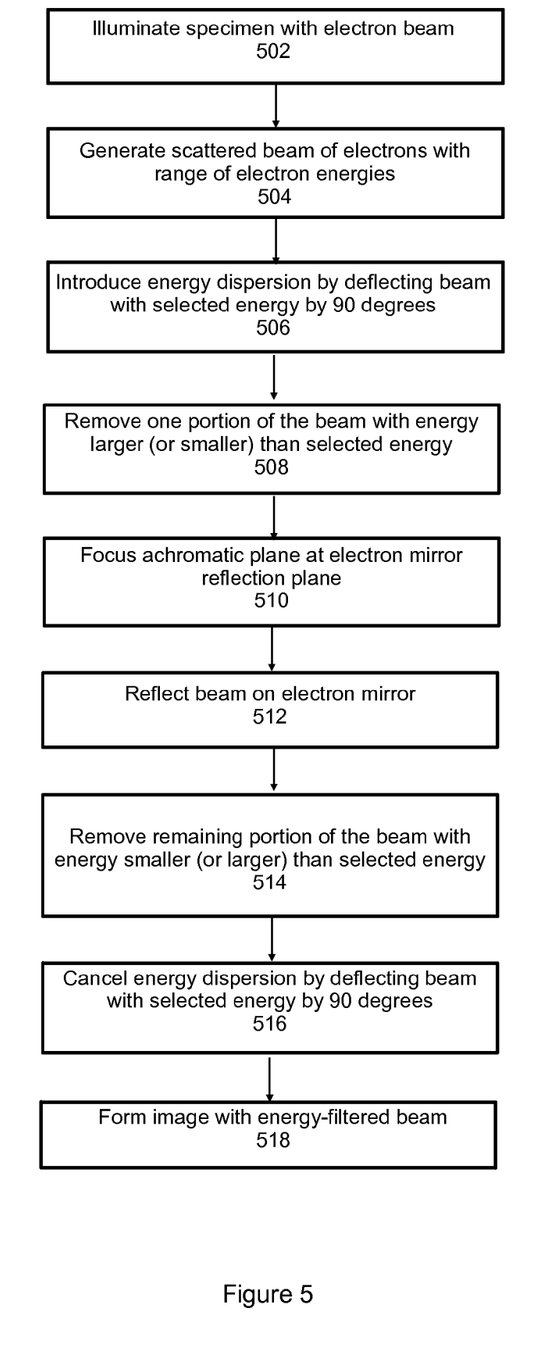
FIG. 5 is a flow chart depicting a method for imaging of a specimen using an electron mirror-based imaging energy filter in accordance with an embodiment of the invention.

FIG. 5 is a flow chart depicting a method 500 for reducing the range of electron beam energies used to form an image that includes a prism array and electron mirror in accordance with an embodiment of the invention. This method 500 may use the structures 100, 402, and 404, as described above in relation to FIGS. 1-4.

A primary electron beam is directed to illuminate 502 the specimen. The primary electrons scatter on the specimen, thus generating a scattered electron beam 504 with a range of electron energies. The electron beam with energy $E_s$ selected for imaging is deflected by 90 degrees 506 to introduce dispersion according to the electron energy. This is done by a magnetic prism separator bending the high-energy component of the beam at less of an angle in comparison to its bending of the low-energy component of the beam, such that the higher and lower energy electron-beam components exit the separator at different angles of trajectory. A knife-edge plate removes one portion of the beam 508, either the beam with energy larger than selected energy $E_s$ or with energy lower than selected energy $E_s$. One or more lenses are used to focus the achromatic plane of the prism separator, located near its center, at the reflection plane 510 of the electron mirror. The mirror reflects the electron beam 512 and due to symmetry, the remaining portion of the beam except the beam with selected energy $E_s$ is removed 514 by the same knife-edge plate. The remaining portion of the electron beam with selected energy $E_s$ is then deflected 516 back by 90 degrees, which cancels the dispersion of the energy filter after the beam exit. The nearly mono-energetic electron beam with selected energy $E_s$ is then directed to impinge on the detection system and form an energy-filtered image 518 of the specimen area illuminated by the electron beam.

CONCLUSION

An imaging energy filter comprising an energy-dispersive prism separator and an electron mirror is disclosed herein.

The prism separator deflects the electron beam by 90 degrees and thus introduces dispersion according to the electron energy. The magnetic prism separator bends the high-energy component of the beam at less of an angle in comparison to its bending of the low-energy component of the beam, such that the higher and lower energy electron-beam components exit the separator at different angles of trajectory. A knife-edge plate removes one portion of the beam with energy larger (or smaller) than the selected energy. One or more lenses are used to focus the achromatic plane of the prism separator, located near the separator center, at the reflection plane of an electron mirror. The mirror reflects the electron beam and due to symmetry, the remaining portion of the beam is removed by the same knife-edge plate. The remaining portion of the electron beam with nominal energy is then deflected back by 90 degrees, which cancels the net dispersion of the energy filter after the beam exits the prism separator.

In accordance with certain embodiments of the invention, this energy filter provides the opportunity to use scattered electrons with a very narrow range of energies for the formation of an image of the specimen. Hence, detailed information about the chemical composition, interatomic bonding and local electronic states is obtainable in electron microscopes used to characterize specimens.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for forming an energy-filtered image from an unfiltered image in an electron microscope, the apparatus comprising:
    an energy-dispersive device that bends the high-energy component of the electron beam scattered by a specimen at less of an angle in comparison to the bending angle of the low-energy component of the electron beam, such that the higher and lower energy electron beam components exit said energy-dispersive device at different angles of trajectory;
    an electron mirror configured to reflect the electron beam, wherein electrons entering at an angle with respect to the normal to the reflection plane of said mirror exit the mirror symmetrically with respect to said normal and at the same angle;
    a first plurality of electron lenses configured to converge all energy components of the electron beam exiting said energy-dispersive device at different angles of trajectory at the electron mirror reflection plane;
    a movable knife-edge plate positioned between the energy-dispersive device and the electron mirror which removes all electrons with energies higher and lower than a selected energy; and
    a second plurality of electron lenses configured to transport the energy-filtered electron beam to an electron detector.

2. The apparatus of claim 1, wherein the energy-dispersive device bends electrons with electron energy selected for imaging by 90 degrees.

3. The apparatus of claim 1, wherein the energy-dispersive device is a magnetic prism composed of an array of uniform magnetic fields of different length and strength with corresponding transient magnetic fields.

4. The apparatus of claim 1, wherein said electron beam is passed through said energy-dispersive device a second time and due to symmetry exits said energy-dispersive device without energy dispersion.

5. The apparatus of claim 1, wherein the strength of said energy-dispersive device is configured to select a specific electron energy for imaging.

6. The apparatus of claim 1, wherein said second plurality of electron lenses forms a two-dimensional electron image on said electron detector.

7. The apparatus of claim 6, wherein said electron detector comprises:
    an electron scintillator transforming said two-dimensional electron image into a light image; and
    a light optics configured to transport said light image to an image sensor.

8. The apparatus of claim 7, further comprising:
    an electron source configured to generate an electron beam;
    a first plurality of electron lenses configured to direct said electron beam on a specimen;
    a specimen scattering said electron beam; and
    a second plurality of electron lenses configured to transport said scattered electron beam into said energy-dispersive device.

9. A method for forming an energy-filtered image from an unfiltered image in an electron microscope, the method comprising:
    illuminating a specimen with an electron beam;
    generating a scattered electron beam with a range of electron energies;
    bending the higher and lower energy scattered electron beam components at different angles of trajectory in an energy-dispersive device;
    converging all energy components of the electron beam bent at different angles of trajectory at the reflection plane of an electron mirror;
    reflecting the electron beam in said electron mirror such that electrons entering at an angle with respect to the normal to the mirror reflection plane exit symmetrically with respect to said normal and at the same angle;
    removing all electrons with energies higher and lower than a selected energy by using a movable knife-edge plate; and
    transporting the remaining energy-filtered electron beam to an electron detector.

10. The method of claim 9, wherein the bending angle is 90 degrees.

11. The method of claim 9, wherein said electron beam is passed through said energy-dispersive device a second time and due to symmetry exits said energy-dispersive device without energy dispersion.

12. The method of claim 9, wherein the strength of the energy-dispersive device is configured to select a specific electron energy for imaging.

13. The method of claim 9, wherein a two-dimensional electron image is formed on said electron detector.

14. The method of claim 13, wherein said electron detector comprises:

an electron scintillator transforming said two-dimensional electron image into a light image; and a light optics configured to transport said light image to an image sensor.

* * * * *